(12) United States Patent
Lee et al.

(10) Patent No.: US 10,424,505 B2
(45) Date of Patent: Sep. 24, 2019

(54) SEMICONDUCTOR DEVICE AND MANUFACTURING METHOD THEREOF

(71) Applicant: SK hynix Inc., Icheon-si, Gyeonggi-do (KR)

(72) Inventors: Yong Woo Lee, Seoul (KR); Jin Ha Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/467,425

(22) Filed: Mar. 23, 2017

(65) Prior Publication Data

US 2018/0082892 A1 Mar. 22, 2018

(30) Foreign Application Priority Data

Sep. 21, 2016 (KR) .................. 10-2016-0120693

(51) Int. Cl.
| | |
|---|---|
| H01L 21/768 | (2006.01) |
| H01L 23/522 | (2006.01) |
| H01L 23/528 | (2006.01) |
| H01L 27/11556 | (2017.01) |
| H01L 27/11582 | (2017.01) |
| H01L 21/28 | (2006.01) |

(52) U.S. Cl.
CPC .. *H01L 21/76871* (2013.01); *H01L 21/28282* (2013.01); *H01L 21/76864* (2013.01); *H01L 23/528* (2013.01); *H01L 23/5226* (2013.01); *H01L 27/11556* (2013.01); *H01L 27/11582* (2013.01)

(58) Field of Classification Search
None
See application file for complete search history.

(56) References Cited

U.S. PATENT DOCUMENTS 5,461,250 A * 10/1995 Burghartz ......... H01L 29/66742
257/192
5,797,998 A * 8/1998 Wenham ........... H01L 31/02242
136/255

(Continued)

FOREIGN PATENT DOCUMENTS

| KR | 100329303 B1 | 3/2002 |
|---|---|---|
| KR | 1020110090056 A | 8/2011 |

OTHER PUBLICATIONS

Chang Woo Byun et al., "High Performance Low Temperature Polycrystalline Si Thin-Film Transistors Fabricated by Silicide Seed-Induced Lateral Crystallization", Electronic Materials Letters, vol. 8, No. 3(2012), pp. 251-258, Jun. 2012.

(Continued)

*Primary Examiner* — David E Graybill
(74) *Attorney, Agent, or Firm* — William Park & Associates Ltd.

(57) ABSTRACT

Provided herein is a method of manufacturing a semiconductor device. The method may include forming an amorphous channel layer. The method may include forming a diffusion barrier on the amorphous channel layer. The method may include forming an amorphous seed layer on the diffusion barrier. The method may include forming a seed layer by crystallizing the amorphous seed layer. The method may include forming a channel layer by crystallizing the amorphous channel layer.

20 Claims, 11 Drawing Sheets

(56) References Cited

U.S. PATENT DOCUMENTS

| | | | | |
|---|---|---|---|---|
| 5,942,050 A * | 8/1999 | Green | H01L 31/076 | 136/258 |
| 5,994,164 A * | 11/1999 | Fonash | H01L 21/2022 | 438/97 |
| 6,911,698 B2 * | 6/2005 | Yamazaki | H01L 21/2022 | 257/350 |
| 6,913,956 B2 * | 7/2005 | Hamada | H01L 21/3226 | 257/E21.413 |
| 7,208,354 B2 * | 4/2007 | Bauer | H01L 21/02381 | 438/151 |
| 7,842,564 B2 * | 11/2010 | Mizushima | H01L 21/02381 | 257/E21.179 |
| 8,481,989 B2 * | 7/2013 | Kai | H01L 27/2409 | 257/2 |
| 9,111,996 B2 * | 8/2015 | Colinge | H01L 21/76251 | |
| 9,318,329 B2 * | 4/2016 | Kohji | H01L 21/28282 | |
| 9,627,395 B2 * | 4/2017 | Zhang | H01L 21/28273 | |
| 9,728,551 B1 * | 8/2017 | Lu | H01L 27/11582 | |
| 9,754,961 B2 * | 9/2017 | Yamasaki | H01L 27/11582 | |
| 2003/0010980 A1 * | 1/2003 | Yamazaki | H01L 21/0237 | 257/65 |
| 2003/0013280 A1 * | 1/2003 | Yamanaka | C23C 16/24 | 438/487 |
| 2004/0106237 A1 * | 6/2004 | Yamazaki | H01L 29/66757 | 438/149 |
| 2004/0219722 A1 * | 11/2004 | Pham | H01L 29/66795 | 438/157 |
| 2005/0054175 A1 * | 3/2005 | Bauer | H01L 21/02381 | 438/404 |
| 2007/0173040 A1 * | 7/2007 | Theodore | H01L 21/02532 | 438/507 |
| 2009/0014828 A1 * | 1/2009 | Mizushima | H01L 21/02381 | 257/506 |
| 2010/0025752 A1 * | 2/2010 | Dong | H01L 21/28273 | 257/324 |
| 2011/0281411 A1 * | 11/2011 | Kitamura | H01L 21/26506 | 438/268 |
| 2011/0291063 A1 * | 12/2011 | Kai | H01L 27/2409 | 257/2 |
| 2012/0273790 A1 * | 11/2012 | Aoyama | H01L 21/02532 | 257/66 |
| 2015/0102471 A1 * | 4/2015 | Colinge | H01L 21/76251 | 257/629 |
| 2016/0233227 A1 * | 8/2016 | Zhang | H01L 27/11556 | |
| 2017/0077125 A1 * | 3/2017 | Yamasaki | H01L 27/11582 | |
| 2017/0229472 A1 * | 8/2017 | Lu | H01L 27/11582 | |
| 2017/0373086 A1 * | 12/2017 | Pang | H01L 29/66833 | |
| 2019/0013330 A1 * | 1/2019 | Kanamori | H01L 28/00 | |

OTHER PUBLICATIONS

Chiung-Wei Lin et al., "Germanium enhanced large-grain growth by pulse mode rapid thermal crystallization process", J Mater Sci: Mater Electron, pp. 18:475-480, Nov. 22, 2006.

Myung-Ho Jung et al., "Characterization of Poly-Si TFTs Using Amorphous $Si_xGe_y$ for a Seed Layer", Journal of the Korean Physical Society, vol. 54, No. 5, pp. 1807-1810, May 2009.

* cited by examiner

SEMICONDUCTOR DEVICE AND MANUFACTURING METHOD THEREOF

CROSS-REFERENCE TO RELATED APPLICATION

The present application claims priority under 35 U.S.C. § 119(a) to Korean patent application number 10-2016-0120693 filed on Sep. 21, 2016 in the Korean Intellectual Property Office, the entire disclosure of which is incorporated herein by reference.

BACKGROUND

1. Technical Field

Various embodiments of the present disclosure may generally relate to a system, and more particularly, to a semiconductor device and a manufacturing method thereof.

2. Related Art

Non-volatile memory devices retain stored data regardless of power on/off conditions. Recently, as a two-dimensional nonvolatile memory device in which a single-layer memory cell is formed on a substrate has reached a limit in enhancing its degree of integration, a three-dimensional nonvolatile memory device in which memory cells are vertically stacked on a substrate has been proposed.

A three-dimensional memory device consists of interlayer insulating layers and gate electrodes that are stacked alternately with each other, and channel layers passing therethrough, with memory cells stacked along the channel layers. To improve the operational reliability of such a non-volatile memory device having a three-dimensional structure, various structures and manufacturing methods have been developed.

SUMMARY

An embodiment of the present disclosure may provide a method of manufacturing a semiconductor device. The method may include forming an amorphous channel layer. The method may include forming a diffusion barrier on the amorphous channel layer. The method may include forming an amorphous seed layer on the diffusion barrier. The method may include forming a seed layer by crystallizing the amorphous seed layer. The method may include forming a channel layer by crystallizing the amorphous channel layer.

An embodiment of the present disclosure may provide for a method of manufacturing a semiconductor device. The method may include forming a stack including first material layers and second material layers that are alternately stacked. The method may include forming an opening passing through the stack. The method may include forming a memory layer in the opening. The method may include forming an amorphous channel layer on the memory layer. The method may include forming a diffusion barrier on the amorphous channel layer. The method may include forming a seed layer on the diffusion barrier. The method may include forming a channel layer by crystallizing the amorphous channel layer.

An embodiment of the present disclosure may provide a semiconductor device. The semiconductor device may include a stack including conductive layers and insulating layers that are alternately stacked. The semiconductor device may include a channel layer passing through the stack. The semiconductor device may include a diffusion barrier formed in the channel layer. The semiconductor device may include a seed layer formed in the diffusion barrier. The semiconductor device may include a core layer formed in the seed layer.

DETAILED DESCRIPTION

Figure 1:
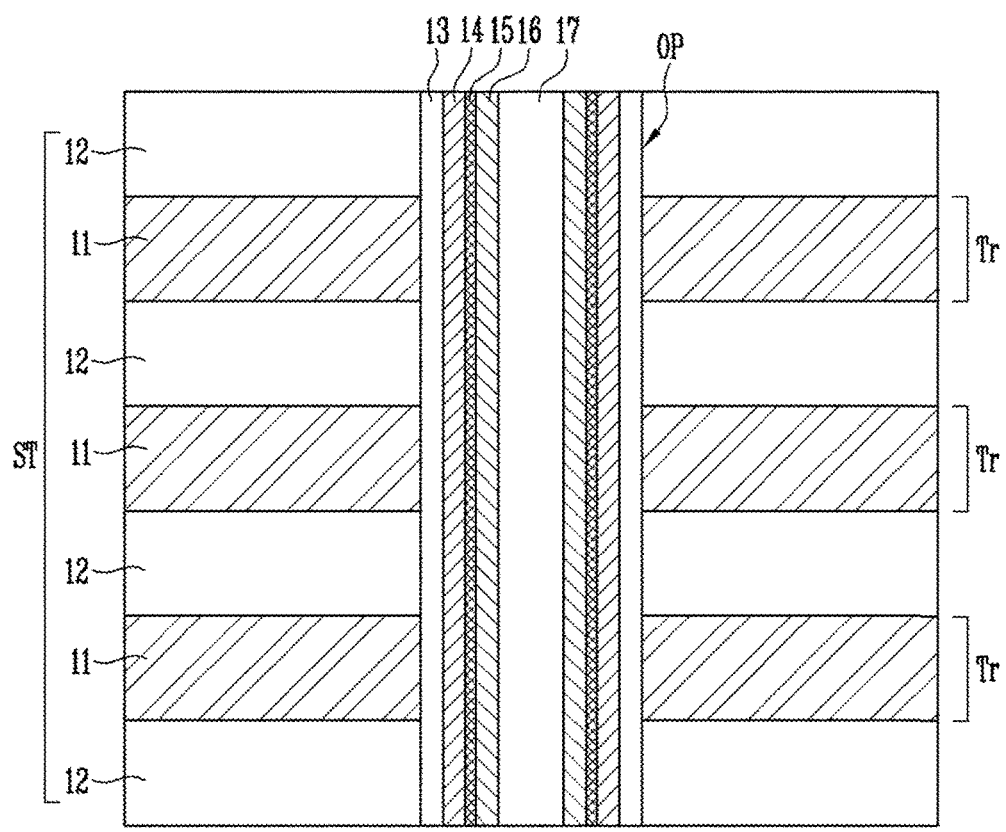
FIG. 1 is a sectional view illustrating a representation of an example of the configuration of a semiconductor device according to an embodiment of the present disclosure.

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiments of the present disclosure may be directed to a semiconductor memory device which is configured to facilitate the manufacturing process thereof and has a stable structure and improved characteristics, and a method of manufacturing the same.

FIG. 1 is a sectional view illustrating the configuration of a semiconductor device according to an embodiment of the present disclosure.

Referring to FIG. 1, the semiconductor device according to an embodiment of the present disclosure includes a stack ST including conductive layers 11 and insulating layers 12 which are alternately stacked. Furthermore, the semiconductor device includes a core layer 17 that passes through the stack ST, a seed layer 16 that surrounds the core layer 17, a diffusion barrier 15 that encloses the seed layer 16, a channel layer 14 that surrounds the diffusion barrier 15, and a memory layer 13 that surrounds the channel layer 14. Here, the memory layer 13, the core layer 17, the seed layer 16, the diffusion barrier 15 and the channel layer 14 may pass through the stack ST in a stacking direction of the conductive layers 11 and the insulating layers 12.

According to this structure, transistors Tr are formed in respective regions in which the channel layer 14 and the conductive layers 11 intersect with each other. The plurality of transistors Tr are stacked along the channel layer 14. Each of the transistors Tr may be a memory cell or a select transistor. In addition, at least one source select transistor, a plurality of memory cells and at least one drain select transistor may be successively stacked, and one memory string may be configured by coupling them in series.

The memory layer 13 may function as a data storage of the memory cells or a gate insulating layer of the select transistor. For example, the memory layer 13 may include at least one of a charge blocking layer, a data storage layer and a tunnel insulating layer. Furthermore, the memory layer 13 may be interposed only in an interface between the channel layer 14 and the conductive layers 11, or may be interposed both at the interface between the channel layer 14 and the conductive layers 11 and at interfaces between the conductive layers 11 and the insulating layers 12.

The channel layer 14 may be a region in which a channel of the transistor Tr is formed, and may be a polysilicon layer. The seed layer 16 may function to provide a seed during a process of crystallizing the channel layer 14, and may be a polysilicon-germanium layer. Furthermore, the diffusion barrier 15 may be provided to prevent elements included in the seed layer 16 from diffusing to the channel layer 14 or the memory layer 13 during the process of crystallizing the channel layer 14. The diffusion barrier 15 may be an oxide layer.

Elements included in the seed layer 16, for example, germanium Ge, function as the nuclei in crystallization process, and thus promote the crystallization and grain growth of the seed layer 16. Therefore, the seed layer 16 has a relatively large grain size. The higher the concentration of germanium (Ge) included in the seed layer 16, the larger the grain size is. During the crystallization process, the germanium (Ge) included in the seed layer 16 may be diffused. However, the diffusion barrier 15 prevents the germanium (Ge) of the seed layer 16 from diffusing to the channel layer 14. Therefore, the seed layer 16 may have a predetermined concentration gradient in the thickness direction in such a way that the concentration of the germanium (Ge) may be gradually increased toward the diffusion barrier 15.

The channel layer 14 has grain structure and grain size similar to those of the seed layer 16. During the process of forming the channel layer 14 by crystallizing an amorphous channel layer, the grain structure of the seed layer 16 is transcribed into the channel layer 14. Therefore, the channel layer 14 may have a relatively large grain size. The words "relatively large grain size" refers to and for example that the grain size is increased compared to that of a conventional channel layer. For example, it refers to the grain size being increased compared to that of a polysilicon layer that is crystallized without using a seed layer.

The diffusion barrier 15 is interposed at the interface between the channel layer 14 and the seed layer 16, and thus functions not only as a passage for transcribing the grain structure of the seed layer 16 into the channel layer 14 but also to prevent the elements of the seed layer 16 from diffusing to the channel layer 14. If the diffusion barrier 15 is excessively thick, diffusion of impurities may be reliably prevented, but it may be difficult to transcribe the grain structure. If the diffusion barrier 15 is excessively thin, the grain structure may be easily transcribed, but it may be difficult to prevent the diffusion of impurities. Therefore, the thickness of the diffusion barrier 15 must be appropriately adjusted such that not only may diffusion of impurities be prevented but the grain structure of the seed layer may also be easily transcribed into the channel layer 14. For example, the diffusion barrier 15 is formed to have a thickness of several angstroms. Preferably, the diffusion barrier 15 may have a thickness ranging from 1 Å to 10 Å.

The core layer 17 with which the seed layer 16 is filled may be an insulating layer. For example, the core layer 17 may include an oxide such as PSZ (Polysilazane) or the like. It is also possible that the seed layer 16 is removed or the seed layer 16 and the diffusion barrier 15 are removed before the core layer 17 is formed. In this case, the diffusion barrier 15 may be filled with the core layer 17, or the channel layer 14 may be filled with the core layer 17.

According to the above-described configuration, the channel layer 14 includes grains having relatively large sizes, whereby the grain boundary in the channel layer 14 is reduced. Therefore, the carrier mobility may be increased, and the cell current of the transistor may be improved. Furthermore, the diffusion barrier 15 prevents the elements of the seed layer 16 from diffusing to the channel layer 14 or the memory layer 13. Therefore, characteristics, for example, carrier mobility, of the channel layer 14 may be prevented from deteriorating due to impurities. Consequently, electric characteristics of the transistor Tr or the reliability of the semiconductor device may be prevented from being deteriorated.

Figure 2A:
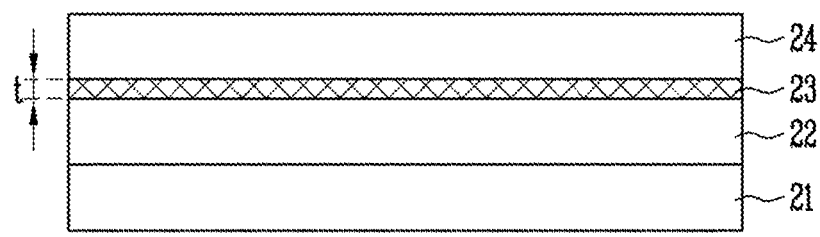
FIGS. 2A and 2B are sectional views illustrating representations of examples of a method of manufacturing the semiconductor device according to an embodiment of the present disclosure.
Figure 2B:
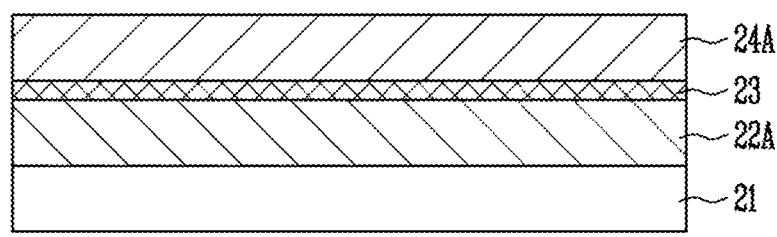

FIGS. 2A and 2B are sectional views illustrating a method of manufacturing the semiconductor device according to an embodiment of the present disclosure.

Referring to FIG. 2A, after a diffusion barrier 23 is formed on an amorphous channel layer 22, an amorphous seed layer 24 is formed on the diffusion barrier 23. The amorphous channel layer 22 is provided to form a channel layer for memory cells, select transistors, etc., and the amorphous seed layer 24 functions to provide a seed when the amorphous channel layer 22 is crystallized. The amorphous seed layer 24 includes elements which function as the nuclei during the crystallization process. For example, the amorphous channel layer 22 may be an amorphous silicon layer, and the amorphous seed layer 24 may be an amorphous silicon-germanium layer.

The diffusion barrier 23 may be provided to prevent diffusion of impurity, and may be an oxide layer. For example, after the amorphous channel layer 22 is formed, the diffusion barrier 23 having a thickness t of several angstroms may be formed on the surface of the amorphous channel layer 22 through an oxidation process. The oxidation process may be implemented as a wet oxidation process that uses sulfuric acid ($H_2SO_4$), etc. In an embodiment, after the amorphous channel layer 22 is formed, a natural oxidation layer having a thickness t of several angstroms may be formed on the surface of the amorphous channel layer 22.

For reference, before the amorphous channel layer 22 is formed, a memory layer 21 may be formed. The memory layer 21 may be a gate insulating layer of a select transistor or a data storage of memory cells.

Referring to FIG. 2B, a seed layer 24A is formed by crystallizing the amorphous seed layer 24. Here, because elements of the seed layer 24A function as the nuclei for crystallization, the crystallization is promoted, and grains grow to have relatively large sizes. The grain structure of the seed layer 24A is transcribed into the amorphous channel layer 22 through the diffusion barrier 23. Therefore, the amorphous channel layer 22 is crystallized according to the grain structure of the seed layer 24A, and grains grow to have relatively large sizes and thus form the channel layer 22A. Crystallization of the amorphous seed layer 24 and the amorphous channel layer 22 may be implemented by a thermal process. For example, the thermal process is performed using Rapid Thermal Process (RTP), a furnace, annealing, laser, etc.

For instance, in the case where the amorphous seed layer 24 is an amorphous silicon-germanium layer and the amorphous channel layer 22 is an amorphous silicon layer, the amorphous silicon-germanium layer is crystallized by the thermal process. Here, the germanium (Ge) absorbs thermal energy and functions as nuclei for crystallization. Therefore, crystallization of the amorphous silicon-germanium layer is promoted and grains grow to have relatively large sizes. In addition, the grain structure of the polysilicon-germanium layer is transcribed into the amorphous silicon layer and thus crystallization of the amorphous silicon layer is promoted. Therefore, the amorphous silicon layer is crystallized as a polysilicon layer.

As the crystallization speed is increased due to the concentration of germanium included in the amorphous silicon-germanium layer is increased, the polysilicon-germanium layer is crystallized earlier than the amorphous silicon layer. Therefore, atoms of the amorphous silicon-germanium layer are first regularly arranged and crystallized, and grains thereof may grow to have relatively large sizes. In addition, as the grain structure of the polysilicon-germanium layer is used as a seed when the amorphous silicon layer is crystallized, activation energy required when the amorphous silicon layer is crystallized is reduced. Thus, crystallization may be performed at comparatively low temperatures. In addition, as the grain structure of the polysilicon layer is influenced by the grain structure of the polysilicon-germanium layer, the polysilicon layer is formed with grains of relatively large sizes.

During the crystallization process, the diffusion barrier 23 prevents the elements included in the amorphous seed layer 24 or the seed layer 24A from diffusing to the amorphous channel layer 22 or the channel layer 22A. For example, the diffusion barrier 23 prevents the germanium included in the amorphous silicon-germanium layer or the polysilicon-germanium layer from diffusing to the amorphous silicon layer or the polysilicon layer.

According to the above-described process, the channel layer 22A having a large grain size may be easily formed, and impurities may be prevented from diffusing to the channel layer 22A. Therefore, the mobility of the channel layer 22A may be improved.

FIGS. 3A to 3E are sectional views illustrating a method of manufacturing the semiconductor device according to an embodiment of the present disclosure.

Figure 3A:
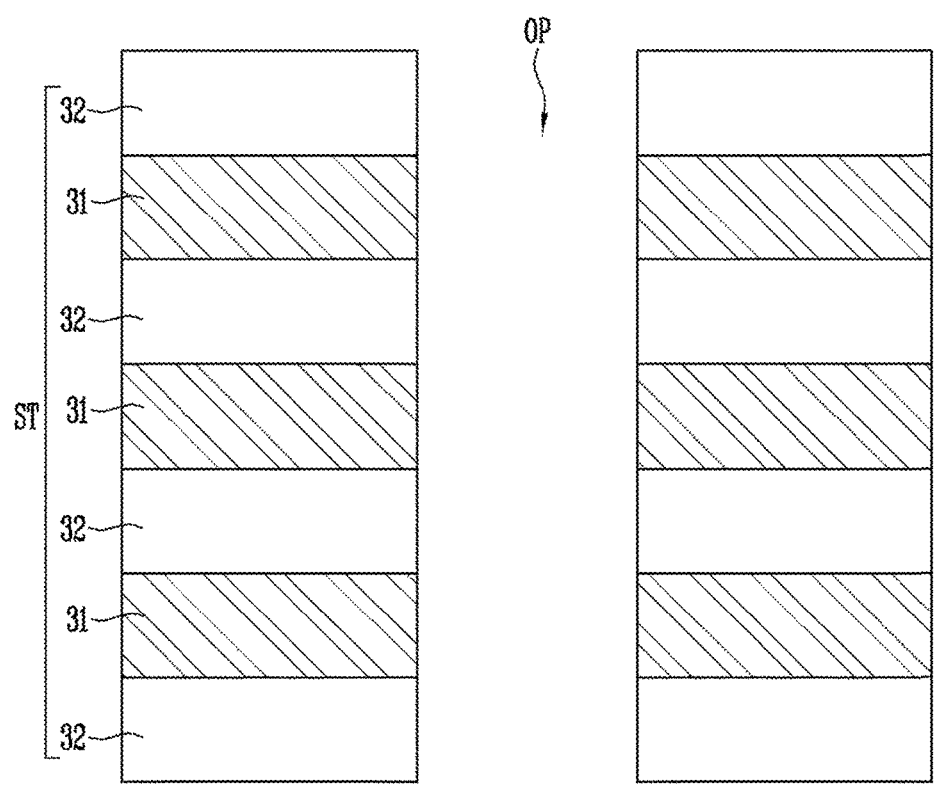
FIGS. 3A to 3F are sectional views illustrating representations of examples of a method of manufacturing the semiconductor device according to an embodiment of the present disclosure.

Referring to FIG. 3A, first material layers 31 and second material layers 32 are alternately stacked, thus forming a stack ST. The stack ST may be provided to form memory strings including memory cells that are vertically stacked, and may have a high aspect ratio.

The first material layers 31 may be provided to form memory cells, gate electrodes of select transistors, and the like. The second material layers 32 may be provided to form insulating layers for insulating stacked gate electrodes from each other. Here, the first material layers 31 are made of material having a high etch selectivity with respect to the second material layers 32. For example, the first material layers 31 may be sacrificial layers including a nitride or the like, and the second material layers 32 may be insulating layers including an oxide or the like. Alternatively, the first material layers 31 may be conductive layers including polysilicon, tungsten, or the like, and the second material layers 32 may be insulating layers including an oxide or the like. As a further alternative, the first material layers 31 may be conductive layers including doped polysilicon or the like, and the second material layers 32 may be sacrificial layers including undoped polysilicon or the like.

Thereafter, an opening OP passing through the stack ST is formed. The opening OP passes through the stack ST in a stack direction, and has a high aspect ratio. Furthermore, the opening OP may have a cross-section such as a circle, an oval, a rectangle or a polygon. Although, in the drawing of the present disclosure, the single opening OP is illustrated, a plurality of openings OP may be formed. The plurality of openings OP may be arranged in a first direction and in a second direction intersecting the first direction, and in a zigzag shape in which the centers thereof are misaligned from each other.

Figure 3B:
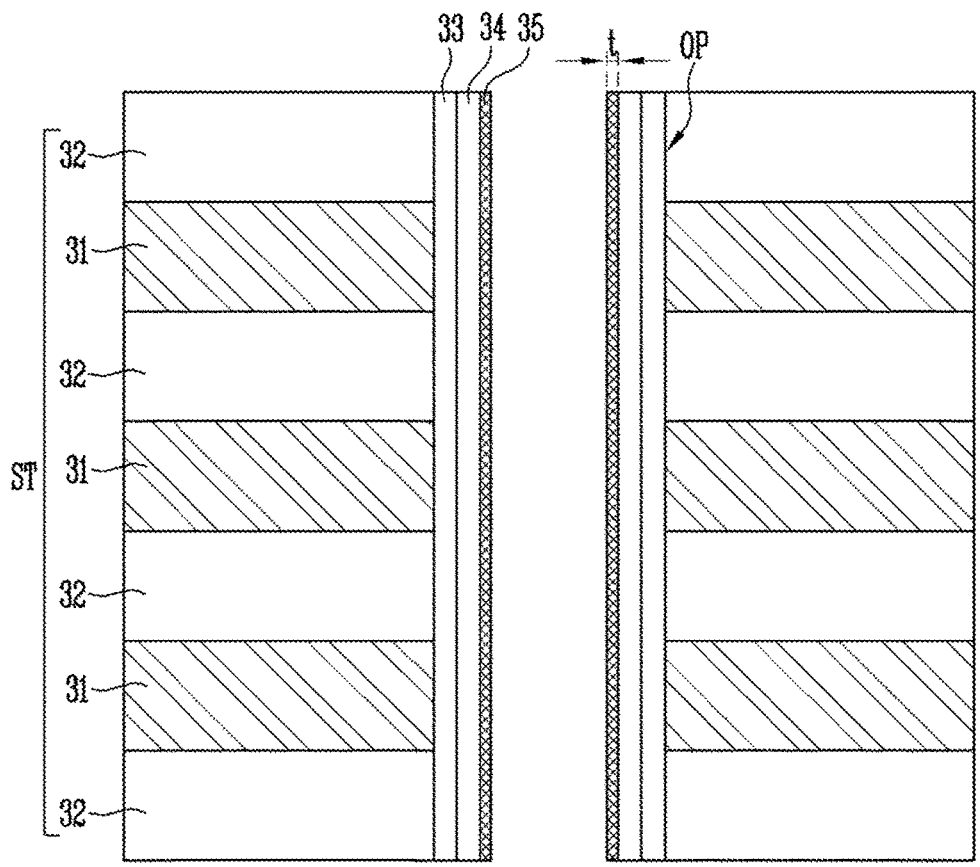

Referring to FIG. 3B, an amorphous channel layer 34 is formed in the opening OP. The amorphous channel layer 34 is formed on an inner surface of the opening OP, and has a thickness at which the opening OP is not completely filled with the amorphous channel layer 34. For example, the amorphous channel layer 34 may be an amorphous silicon layer.

Before the amorphous channel layer 34 is formed, a memory layer 33 may be formed in the opening OP. The memory layer 33 may be a multilayer dielectric layer, and include a charge blocking layer, a data storage layer and a tunnel insulating layer that are successively stacked, or include at least one of them. The data storage layer may include a floating gate, charge trap material, nanodots, phase-change material, etc.

Thereafter, a diffusion barrier 35 is formed on the amorphous channel layer 34. The diffusion barrier 35 may be provided to prevent diffusion of impurities between layers during a following process, and may be an oxide layer. For example, after the amorphous channel layer 34 is formed, the diffusion barrier 35 having a thickness t of several angstroms may be formed on the surface of the amorphous channel layer 34 through an oxidation process. The oxidation process may be implemented as a wet oxidation process that uses sulfuric acid ($H_2SO_4$), etc. In an embodiment, after the amorphous channel layer 34 is formed, a natural oxidation layer having a thickness t of several angstroms may be formed on the surface of the amorphous channel layer 34.

Figure 3C:
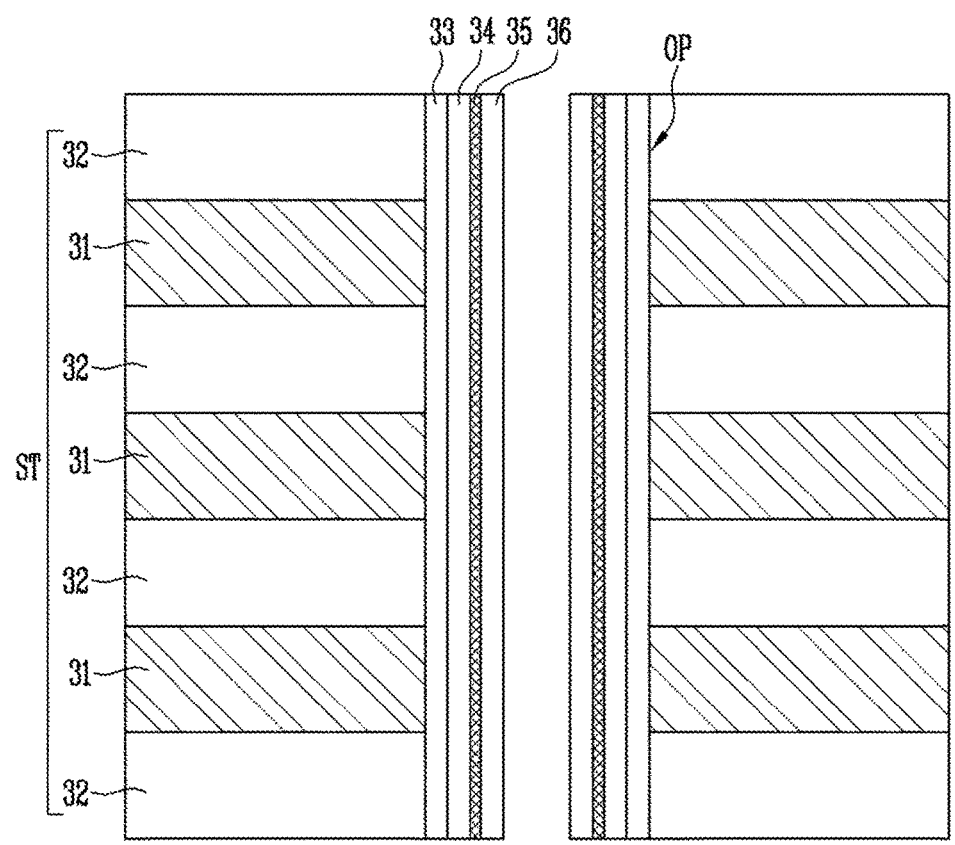

Referring to FIG. 3C, an amorphous seed layer 36 is formed on the diffusion barrier 35. The amorphous seed layer 36 functions to provide a seed when the amorphous channel layer 34 is crystallized, and includes elements that are used as the nuclei during a crystallization process. For example, the amorphous seed layer 36 may be an amorphous silicon-germanium layer including germanium (Ge).

Consequently, the memory layer 33, the amorphous channel layer 34, the diffusion barrier 35 and the amorphous seed layer 36 are formed in the opening OP. The memory layer 33, the amorphous channel layer 34, the diffusion barrier 35 and the amorphous seed layer 36 may be formed with a uniform thickness, at which the opening OP is not completely filled therewith. That is, to open a central region of the opening OP, the memory layer 33, the amorphous channel layer 34, the diffusion barrier 35 and the amorphous seed layer 36 may be formed in a tubular shape. Furthermore, the diffusion barrier 35 may come into direct contact with an outer surface of the amorphous seed layer 36 and an inner surface of the amorphous channel layer 34.

Figure 3D:
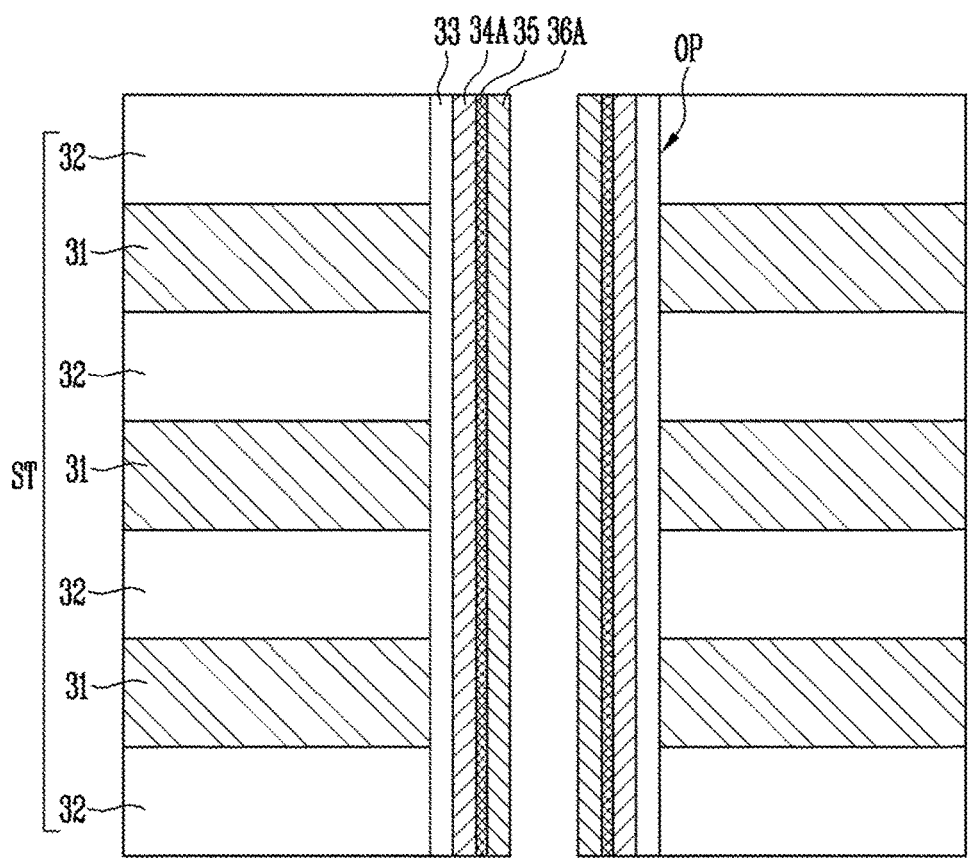

Referring to FIG. 3D, a seed layer 36A and a channel layer 34A are formed by crystallizing the amorphous seed layer 36 and the amorphous channel layer 34. For example, the seed layer 36A is formed by crystallizing the amorphous seed layer 36 through a thermal process. The amorphous channel layer 34 is crystallized by transcribing the grain structure of the seed layer 36A into the amorphous channel layer 34. Consequently, the channel layer 34A is formed.

Because an inner surface of the amorphous seed layer 36 is exposed through the open central region of the opening OP, the amorphous seed layer 36 is generally uniformly crystallized. Therefore, the seed layer 36A has a grain structure with a relatively large uniform size. The channel layer 34A into which the grain structure of the seed layer 36A is transcribed also has a grain structure with a relatively large uniform size.

Figure 3E:
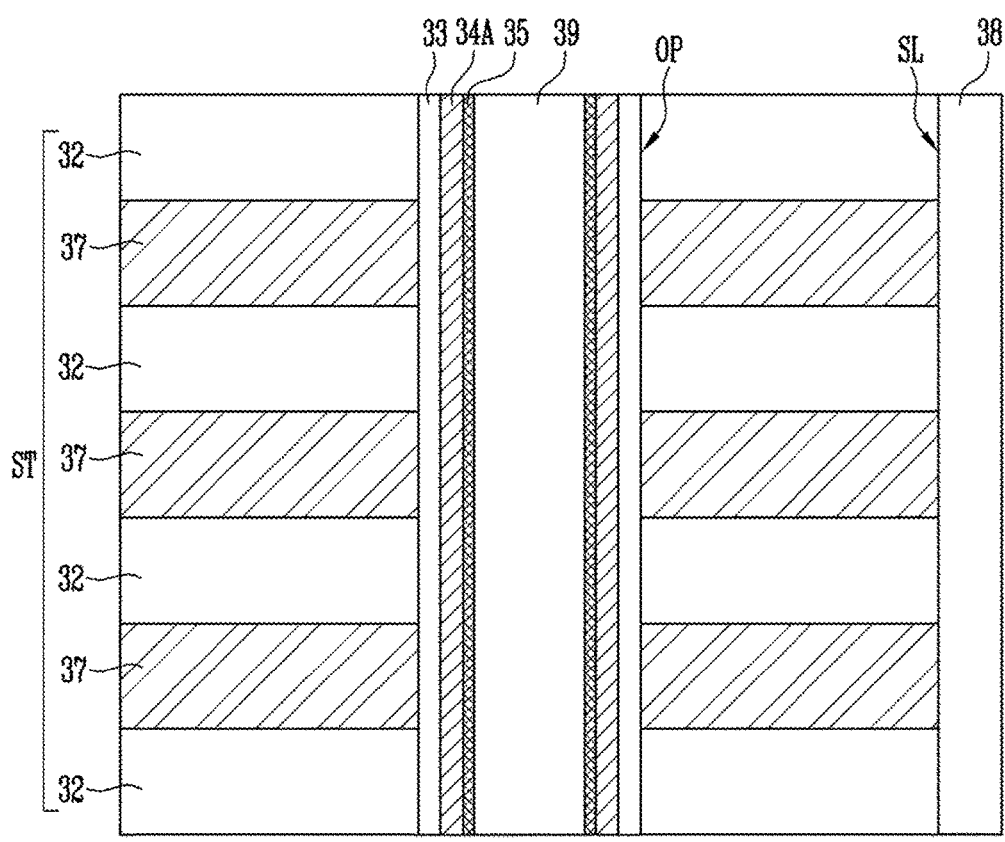
Figure 3F:
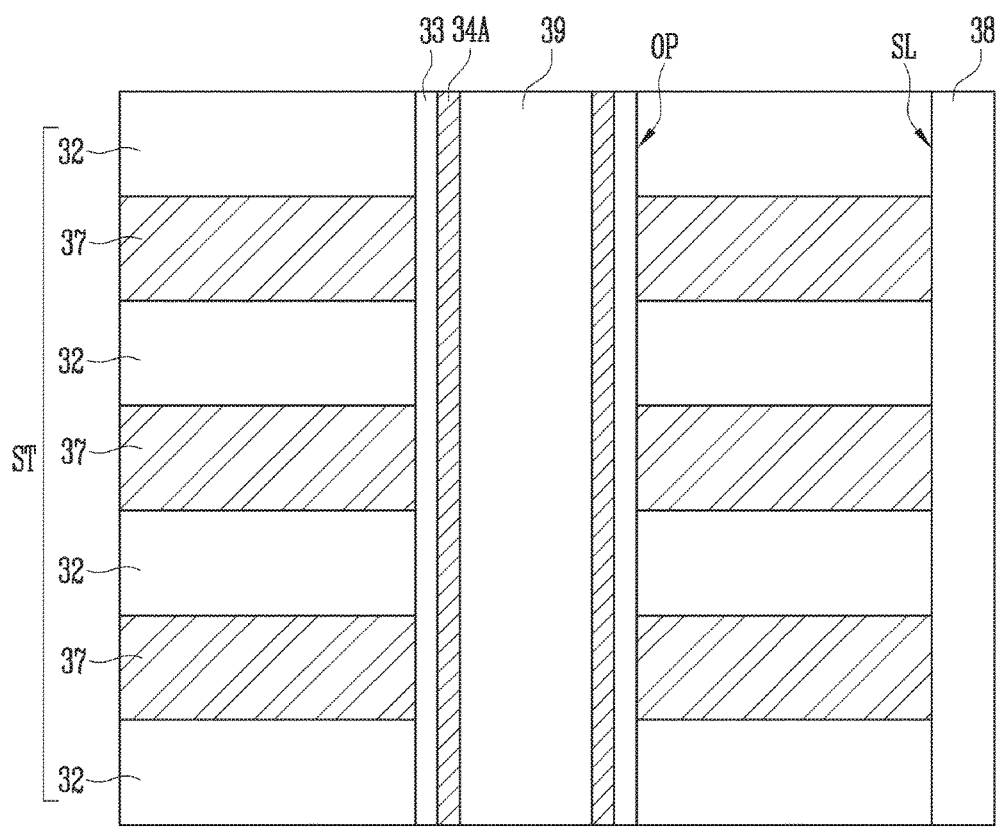

Referring to FIG. 3E, a core layer 39 is formed in the open central region of the opening OP. The core layer 39 may be an insulating layer, and include an oxide such as PSZ (polysilazane) or the like. Here, the core layer 39 may be formed in the seed layer 36A. Alternatively, after the seed layer 36A is removed, the core layer 39 may be formed in the diffusion barrier 35. Alternatively, after the seed layer 36A and the diffusion barrier 35 are removed, the core layer 39 may be formed in the channel layer 34A as shown in FIG. 3F.

Thereafter, a slit SL passing through the stack ST is formed. The slit SL may have a depth to completely pass through the stack ST, or a depth to partially pass through the stack ST.

Thereafter, the first material layers 31 or the second material layers 32 are replaced with third material layers 37. For example, in the case where the first material layers 31 are sacrificial layers and the second material layers 32 are insulating layers, conductive layers may substitute for the first material layers 31. The conductive layers may include metal such as tungsten or the like. In an example, in the case where the first material layers 31 are conductive layers and the second material layers 32 are insulating layers, metal silicide layers are formed by siliciding the first material layers 31. In an example, in the case where the first material layers 31 are conductive layers and the second material layers 32 are sacrificial layers, insulating layers may substitute for the second material layers 32.

Thereafter, an insulating layer 38 is formed in the slit SL. For reference, before the third material layers 37 substitute for the first material layers 31, additional memory layers may be formed. For example, after the first material layers 31 are removed through the slit SL to form openings, memory layers are formed in the openings. Thereafter, conductive layers are respectively formed in the openings in which the memory layers have been formed. Here, the memory layers may include at least one of a charge blocking layer, a data storage layer and a tunnel insulating layer. Furthermore, the data storage layer may include a floating gate, charge trap material, nanodots, phase-change material, etc.

Figure 4:
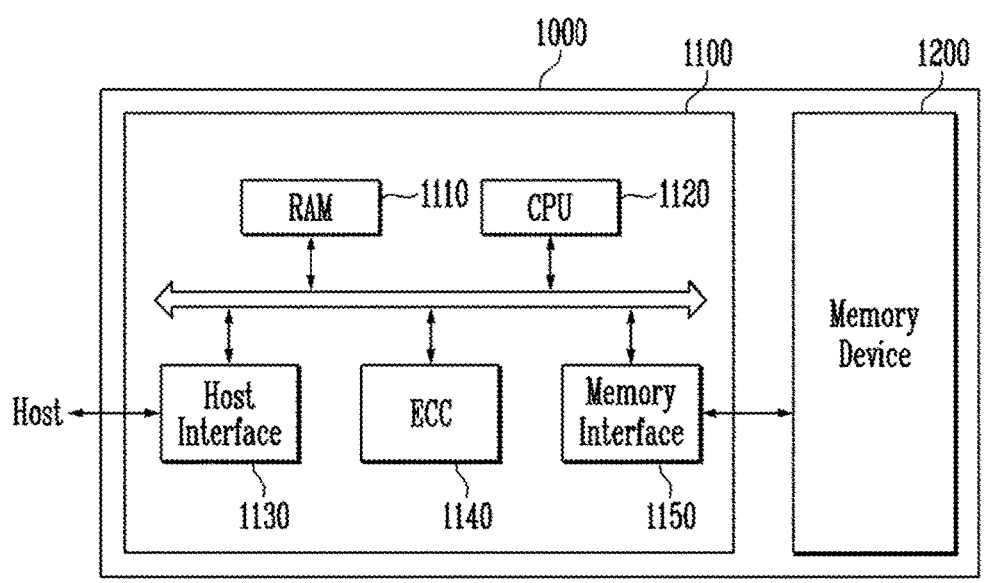
FIGS. 4 and 5 are block diagrams illustrating a representation of an example of the configuration of a memory system according to an embodiment of the present disclosure.

FIG. 4 is a block diagram illustrating the configuration of a memory system according to an embodiment of the present disclosure.

Referring FIG. 4, the memory system 1000 according to an embodiment of the present disclosure includes a memory device 1200 and a controller 1100.

The memory device 1200 is used to store data information having a variety of data forms such as text, graphics, software codes, and so on. The memory device 1200 may be a nonvolatile memory. Furthermore, the memory device 1200 may have a structure described above with reference to FIG. 1, and be manufactured by the manufacturing methods described above with reference to FIGS. 2A to 3E. The structure of the memory device 1200 and the manufacturing methods thereof are the same as those described above; therefore, explanations thereof will be omitted.

The controller 1100 is coupled to a host and the memory device 1200 and configured to access the memory device 1200 in response to a request from the host. For example, the controller 1100 is configured to control read, write, erase, and background operations of the memory device 1200.

The controller 1100 includes a random access memory (RAM; 1110), a central processing unit (CPU; 1120), a host interface 1130, an error correction code (ECC) circuit 1140, a memory interface 1150, and so on.

The RAM 1110 can be used as an operation memory of the CPU 1120, a cache memory between the memory device 1200 and the host, a buffer memory between the memory device 1200 and the host, or the like. For reference, the RAM 1110 may be replaced with a static random access memory (SRAM), a read only memory (ROM), or the like.

The CPU 1120 is configured to control the overall operation of the controller 1100. For example, the CPU 1120 is configured to operate the same firmware as that of a flash translation layer (FTL) stored in the RAM 1110.

The host interface 1130 is configured to interface with the host. In an embodiment, the controller 1100 may be configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 uses an error correction code (ECC) to detect and correct errors in data read from the memory device 1200.

The memory interface 1150 is configured to interface with the memory device 1200. For example, the memory interface 1150 includes a NAND interface or a NOR interface.

For reference, the controller 1100 may further include a buffer memory (not illustrated) for temporarily storing data. The buffer memory may be used to temporarily store data to be transferred from the host interface 1130 to the outside or data to be transferred from the memory interface 1150 to the memory device 1200. The controller 1100 may further include a ROM which stores code data to interface with the host.

Since the memory system 1000 according to an embodiment may include the memory device 1200 having perhaps improved integration and characteristics, the integration and characteristics of the memory system 1000 may also be improved.

Figure 5:
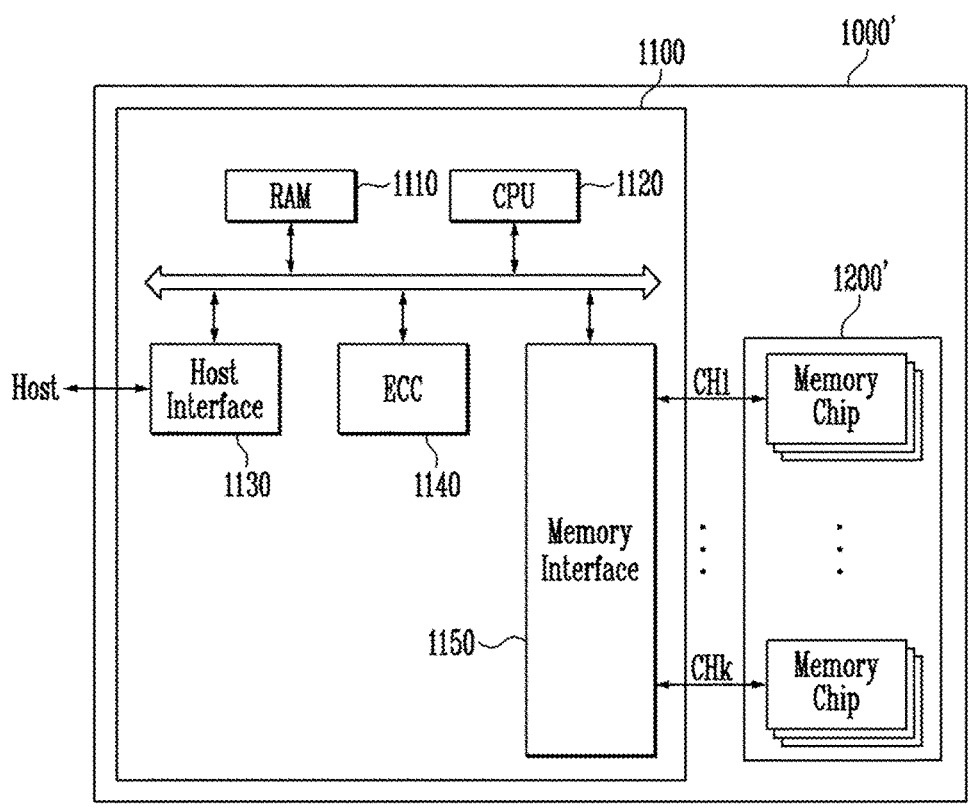

FIG. 5 is a block diagram illustrating the configuration of a memory system according to an embodiment of the present disclosure. Hereinbelow, repetitive explanation will be omitted if deemed redundant.

Referring FIG. 5, the memory system 1000' according to the embodiments of the present disclosure includes a memory device 1200' and a controller 1100. The controller 1100 includes a RAM 1110, a CPU 1120, a host interface 1130, an ECC circuit 1140, a memory interface 1150, and so on.

The memory device 1200' may be a nonvolatile memory. Furthermore, the memory device 1200' may have a structure described above with reference to FIG. 1, and be manufactured by the manufacturing methods described above with reference to FIGS. 2A to 3E. The structure of the memory device 1200' and the manufacturing methods thereof are the same as those described above; therefore, explanations thereof will be omitted.

The memory device 1200' may be a multi-chip package including a plurality of memory chips. The plurality of memory chips are divided into a plurality of groups. The plurality of groups are configured to communicate with the controller 1100 through first to $k_{th}$ channels CH1 to CHk. The memory chips of each group communicate with the controller 1100 through a common channel. For reference, the memory system 1000' may be modified such that each single memory chip is coupled to a corresponding single channel.

As described above, since the memory system 1000' according to an embodiment may include the memory device 1200' having perhaps improved integration and characteristics, the integration and characteristics of the memory system 1000' may also be improved. In particular, the memory device 1200' according to the present embodiments is formed of a multi-chip package, whereby the data storage capacity of the memory system 1000' and the operating speed thereof can be enhanced.

Figure 6:
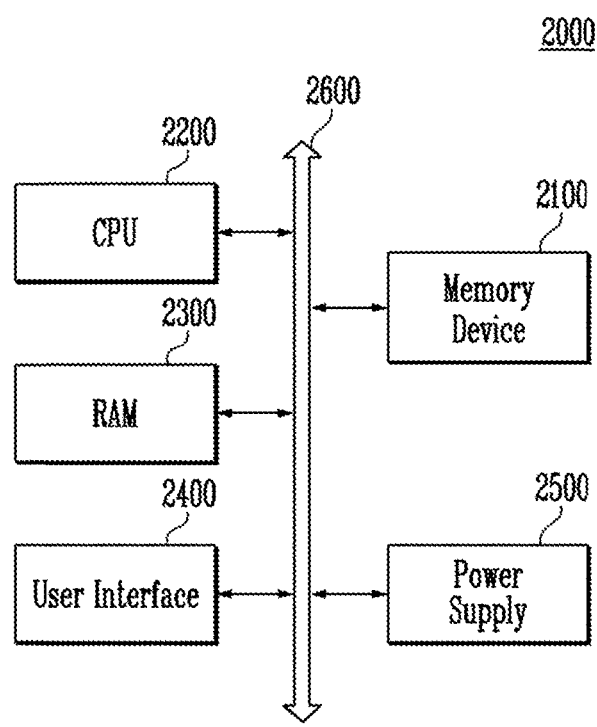
FIGS. 6 and 7 are block diagrams illustrating a representation of an example of the configuration of a computing system according to an embodiment of the present disclosure.

FIG. 6 is a block diagram illustrating the configuration of a computing system according to an embodiment of the present disclosure. Hereinbelow, repetitive explanation will be omitted if deemed redundant.

Referring to 6, the computing system 2000 according to an embodiment of the present disclosure includes a memory device 2100, a central processing unit (CPU) 2200, a random access memory (RAM) 2300, a user interface 2400, a power supply 2500, a system bus 2600, and so forth.

The memory device 2100 stores data provided via the user interface 2400, data processed by the CPU 2200, etc. Furthermore, the memory device 2100 is electrically coupled to the CPU 2200, the RAM 2300, the user interface 2400, the power supply 2500, etc. by the system bus 2600. For example, the memory device 2100 may be coupled to the system bus 2600 via a controller (not illustrated) or, alternatively, directly coupled to the system bus 2600. In the case where the memory device 2100 is directly coupled to the system bus 2600, the function of the controller may be performed by the CPU 2200, the RAM 2300, etc.

The memory device 2100 may be a nonvolatile memory. Furthermore, the memory device 2100 may have a structure described above with reference to FIG. 1, and be manufactured by the manufacturing methods described above with reference to FIGS. 2A to 3E. The structure of the memory device 2100 and the manufacturing methods thereof are the same as those described above; therefore, explanations thereof will be omitted.

Furthermore, the memory device 2100 may be a multi-chip package including a plurality of memory chips, as illustrated with reference to FIG. 5.

The computing system 2000 having an above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting and receiving (transmitting/receiving) information in an wireless environment, one of various devices for forming a home network, one of various electronic devices for forming a computer network, one of various electronic devices for forming a telematics network, an RFID device, or the like.

Since the computing system 2000 according to an embodiment may include the memory device 2100 having perhaps improved integration and characteristics, characteristics of the computing system 2000 may also be improved.

Figure 7:
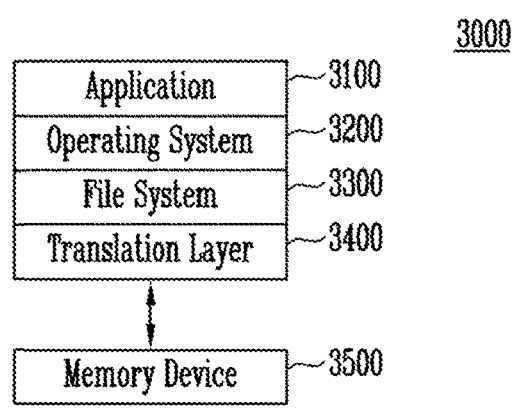

FIG. 7 is a block diagram illustrating a computing system according to an embodiment of the present disclosure.

Referring to FIG. 7, the computing system 3000 according to an embodiment of the present disclosure may include a software layer which has an operating system 3200, an application 3100, a file system 3300, a translation layer 3400, and so forth. Furthermore, the computing system 3000 includes a hardware layer such as a memory device 3500.

The operating system 3200 manages software resources and hardware resources, etc. of the computing system 3000 and may control program execution by the CPU. The application 3100 may include various application programs to be executed in the computing system 3000 and may be a utility executed by the operating system 3200.

The file system 3300 refers to a logical structure for controlling data, files, etc. which are present in the computing system 3000 and organizes files or data to be stored in the memory device 3500 or the like according to a given rule. The file system 3300 may be determined depending on the operating system 3200 used in the computing system 3000. For example, if the operating system 3200 is Microsoft's Windows system, the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like.

Although the operating system 3200, the application 3100 and the file system 3300 are expressed by separate blocks in the drawing, the application 3100 and the file system 3300 may be included in the operating system 3200.

The translation layer 3400 translates an address into a suitable form for the memory device 3500 in response to a request from the file system 3300. For example, the translation layer 3400 translates a logical address produced by the file system 3300 into a physical address of the memory device 3500. Mapping information of the logical address and physical address may be stored in an address translation table. For example, the translation layer 3400 may be a flash translation layer (FTL), a universal flash storage link layer (ULL), or the like.

The memory device 3500 may be a nonvolatile memory. Furthermore, the memory device 3500 may have a structure described above with reference to FIG. 1, and be manufactured by the manufacturing methods described above with reference to FIGS. 2A to 3E. The structure of the memory device 3500 and the manufacturing methods thereof are the same as those described above; therefore explanations thereof will be omitted.

The computing system 3000 having an above-mentioned configuration may be divided into an operating system layer implemented in an upper level region and a controller layer implemented in a lower level region. The application 3100, the operating system 3200, and the file system 3300 may be included in the operating system layer, and may be driven by an operating memory of the computing system 3000. The translation layer 3400 may be included in the operating system layer or the controller layer.

Since the computing system 3000 according to an embodiment may include the memory device 3500 having perhaps improved integration and characteristics, characteristics of the computing system 3000 may also be improved.

As described above, a channel layer is formed through a process in which an amorphous channel layer is crystallized by transcribing a grain structure of a seed layer into the amorphous channel layer. Consequently, the grain size of the channel layer may be increased. Furthermore, a diffusion barrier is formed between the amorphous channel layer and the seed layer. Thereby, elements of the seed layer may be prevented from diffusing to the amorphous channel layer. Therefore, a change in properties of the channel layer due to the elements of the seed layer may be prevented, whereby deterioration in reliability and electric characteristics of the semiconductor device may be prevented.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor memory device, comprising:
    forming a stack including first material layers and second material layers that are alternately stacked;
    forming an opening passing through the stack;
    forming a memory layer in the opening;
    forming an amorphous channel layer in the memory layer;
    forming a diffusion barrier in the opening to contact the amorphous channel layer;
    forming an amorphous seed layer in the opening to contact the diffusion barrier;
    forming a seed layer by crystallizing the amorphous seed layer;
    forming a channel layer by crystallizing the amorphous channel layer, wherein a grain structure of the seed layer is transcribed into the amorphous channel layer through the diffusion barrier when the amorphous channel layer is crystallized; and
    removing the seed layer to expose the diffusion barrier,
    wherein the amorphous seed layer includes an element used as nuclei during the crystallizing and the diffusion barrier prevents the nuclei from diffusing to the amorphous channel layer or the channel layer.

2. The method according to claim 1, wherein the amorphous seed layer and the amorphous channel layer are crystallized by a thermal process.

3. The method according to claim 1, wherein the forming of the diffusion barrier uses a wet oxidation process.

4. The method according to claim 1, wherein the amorphous channel layer is an amorphous silicon layer and the channel layer is a polysilicon layer.

5. The method according to claim 1, wherein the diffusion barrier is an oxide layer.

6. The method according to claim 1, wherein the amorphous seed layer is an amorphous silicon-germanium layer and the seed layer is a polysilicon-germanium layer.

7. The method according to claim 6, wherein the amorphous seed layer includes germanium as nuclei, and the seed layer is crystallized to have a greater grain size as a concentration of germanium in the seed layer is greater.

8. The method according to claim 6, wherein the diffusion barrier prevents germanium included in the amorphous seed layer or the seed layer from diffusing to the amorphous channel layer or the channel layer.

9. The method according to claim 1, wherein the diffusion barrier has a thickness ranging from 1 to 10 angstroms.

10. The method according to claim 1, further comprising, before the forming of the amorphous channel layer,
    forming a memory layer including at least one of a charge blocking layer, a data storage layer and a tunnel insulating layer.

11. The method according to claim 10, wherein the diffusion barrier prevents germanium included in the amorphous seed layer or the seed layer from diffusing to the amorphous channel layer, the channel layer or the memory layer.

12. The method according to claim 1, wherein the forming of the amorphous channel layer comprises:

alternately stacking first material layers and second material layers;

forming an opening passing through the first and second material layers; and forming the amorphous channel layer in the opening.

13. The method of claim 1, wherein the amorphous seed layer is crystalized earlier than the amorphous channel layer.

14. A method of manufacturing a semiconductor memory device, comprising:

forming a stack including first material layers and second material layers that are alternately stacked;

forming an opening passing through the stack;

forming a memory layer in the opening;

forming an amorphous channel layer in the opening where the memory layer is formed;

forming a diffusion barrier in the opening where the amorphous channel layer is formed;

forming a seed layer in the opening where the diffusion barrier is formed;

forming a channel layer by crystallizing the amorphous channel layer, wherein a grain structure of the seed layer is transcribed into the amorphous channel layer through the diffusion barrier when the amorphous channel layer is crystallized; and removing the seed layer to expose the diffusion barrier in the opening, wherein the diffusion barrier prevents elements of the seed layer from diffusing to the amorphous channel layer or the channel layer.

15. The method according to claim 14, wherein the amorphous channel layer is crystallized by a thermal process.

16. The method according to claim 14, wherein the forming of the diffusion barrier uses a wet oxidation process.

17. A method of manufacturing a semiconductor memory device, comprising:

forming a stack including first material layers and second material layers that are alternately stacked;

forming an opening passing through the stack;

forming a memory layer in the opening;

forming an amorphous channel layer in the opening where the memory layer is formed;

forming a diffusion barrier in the amorphous channel layer;

forming an amorphous seed layer in the diffusion barrier, wherein the amorphous seed layer includes germanium;

forming a seed layer by crystallizing the amorphous seed layer using the germanium as nuclei;

forming a channel layer by crystallizing the amorphous channel layer; and removing the seed layer to expose the diffusion barrier, wherein a grain structure of the seed layer is transcribed into the amorphous channel layer through the diffusion barrier when the amorphous channel layer is crystallized, and wherein the diffusion barrier prevents the nuclei from diffusing to the amorphous channel layer or the channel layer.

18. The method according to claim 1, further comprising:
removing the diffusion barrier to expose the channel layer.

19. The method according to claim 14, further comprising:
removing the diffusion barrier to expose the channel layer in the opening.

20. The method according to claim 17, further comprising:
removing the diffusion barrier to expose the channel layer in the opening.

* * * * *